US007227346B1

(12) United States Patent
Solbrig

(10) Patent No.: US 7,227,346 B1
(45) Date of Patent: Jun. 5, 2007

(54) TWO CHANNEL DIGITAL PHASE DETECTOR

(75) Inventor: Wayne E. Solbrig, Broomfield, CO (US)

(73) Assignee: Timing Solutions Corporation, Boulder, CO (US)

( * ) Notice: Subject to any disclaimer, the term of this patent is extended or adjusted under 35 U.S.C. 154(b) by 0 days.

(21) Appl. No.: 11/161,946

(22) Filed: Aug. 23, 2005

(51) Int. Cl.
*G01R 25/00* (2006.01)
*G01R 13/02* (2006.01)
*G01R 27/02* (2006.01)
*H04B 1/00* (2006.01)

(52) U.S. Cl. ............................. 324/76.78; 324/76.55; 324/607; 375/140

(58) Field of Classification Search ............. 324/76.55, 324/607, 76.78
See application file for complete search history.

(56) References Cited

U.S. PATENT DOCUMENTS

| 4,090,145 | A |   | 5/1978  | Webb ............................. 329/1 |
|-----------|---|---|---------|-----------------------------------------|
| 4,633,516 | A | * | 12/1986 | Tsui ........................... 455/226.1 |
| 4,752,902 | A |   | 6/1988  | Goldberg .................... 364/721   |
| 4,933,916 | A |   | 6/1990  | May et al. .................... 367/125 |
| 5,172,394 | A |   | 12/1992 | Kuster et al. ................. 375/67  |
| 5,198,748 | A | * | 3/1993  | Tsui et al. ............... 324/76.35    |
| 5,331,293 | A | * | 7/1994  | Shepherd et al. ........... 331/1 R     |
| 5,598,440 | A |   | 1/1997  | Domagala .................... 375/329   |
| 5,844,408 | A | * | 12/1998 | Yoshimura et al. ...... 324/76.52       |
| 5,878,335 | A |   | 3/1999  | Kushner ...................... 455/260  |
| 5,886,752 | A |   | 3/1999  | Cross ........................ 348/724  |
| 5,898,325 | A |   | 4/1999  | Crook et al. ................. 327/105  |
| 6,282,228 | B1 | * | 8/2001  | Monroe ....................... 375/140 |
| 6,785,345 | B2 |   | 8/2004  | Blazo ......................... 375/326 |
| 6,785,346 | B1 |   | 8/2004  | Birkett et al. ............... 375/327  |
| 2003/0202616 | A1 | * | 10/2003 | Jensen et al. ............... 375/316 |
| 2006/0206550 | A1 | * | 9/2006 | Uchino ....................... 708/204 |

* cited by examiner

Primary Examiner—Andrew H. Hirshfeld
Assistant Examiner—Jeff Natalini
(74) Attorney, Agent, or Firm—Christopher J. Kulish, Esq.; Holland & Hart LLP

(57) ABSTRACT

The invention is directed to a digital phase detector that comprises a splitter and phase shifter to receive a signal of a device under test and produce a first signal that is substantially identical to the received signal and a second signal that is phase shifted relative to the first signal. A first analog-to-digital channel processes the first signal to produce an in-phase and quadrature signals. The second signal is processed by a second analog-to-digital channel to produce a second set of in-phase and quadrature signals. The two sets of in-phase and quadrature signals are used to determine a phase difference between the signal of the device under test and a local oscillator signal associated with the two analog-to-digital channels. The invention is further directed to a direct digital synthesizer that is capable of use within the digital phase detector and in other applications. The direct digital synthesizer comprises a sine look-up table or calculator that provides a digital signal representative of the amplitude of a sine wave at an angle of $2\pi kJ/M$ where J is an integer number of cycles of the sine wave, M is an integer number of sine wave data values that represent J cycles of the sine wave, and k is an integer number having a value in a range extending from 1 to and including M. By appropriately selecting the value of M, certain spur related issues can be avoided. Further, appropriate selection of J and M allows the synthesizer to generate frequencies that are rational fractions of the frequency of a clock applied to the synthesizer.

24 Claims, 3 Drawing Sheets

TWO CHANNEL DIGITAL PHASE DETECTOR

FIELD OF THE INVENTION

The present invention relates to a digital phase detector for use in determining the phase difference between the signal produced by a device under test ("DUT") and a reference oscillator.

BACKGROUND OF THE INVENTION

Many applications require precision clocks or oscillators, which are hereinafter collectively referred to as oscillators. For example, many radar systems require precision oscillators that exhibit phase noise that is as much as 180 dB/Hz below the carrier frequency. Consequently, before an oscillator can be integrated into such a system, the oscillator must be tested to determine if oscillator meets the phase noise requirements of the system.

Presently, there is an analog technique that is capable of measuring phase differences that are as much as 180 dB/Hz below the carrier or reference signal. The analog technique involves applying the signal of a DUT and a local oscillator signal to a mixer. The mixer operates to produce an intermediate frequency signal. The intermediate frequency signal is low-pass filtered to produce a signal that is proportional to the sine of the phase difference between the signal of the DUT and the local oscillator signal. If the signal of the DUT and the local oscillator are maintained at or near quadrature, then the sine of the phase difference is approximately equal to the phase difference and the intermediate frequency signal is approximately proportional to the phase fluctuations between the signal of the DUT and the local oscillator signal. The signal of the DUT and the oscillator are maintained at or near quadrature by a control loop, such as a phase-locked loop or controllable delay line.

A digital approach to measuring phase differences involves applying the signal of a DUT to an analog-to-digital converter to produce a digital signal. The analog signal is sampled in accordance with a clock signal generated by a sampling clock. The digital signal is digitally multiplied by digital versions of an in-phase local oscillator signal and of a quadrature local oscillator signal. The product of each of the multiplications is subjected to digital low-pass filtering to produce an in-phase signal and a quadrature signal. Application of the in-phase and quadrature signals to a phase detector that calculates the arctangent of the quotient of the quadrature signal divided by the in-phase signal yields a signal that is indicative of the phase difference between the signal of the DUT and the local oscillator signal. An advantage of this approach relative to the analog approach is that the phase detector does not require two signals that are at or near quadrature to produce a signal that is indicative of the phase difference between the signal of the DUT and the local oscillator signal. The DUT is compared against the internal sampling clock over multiple periods of the arctangent function with no degradation in performance, provided there is sufficient numerical precision to store the total elapsed phase and still resolve noise.

SUMMARY OF THE INVENTION

The present invention is directed to a digital phase detector that is capable of being used in a phase measurement system to make very low phase noise measurements and, in one embodiment, as low as about 180 dB/Hz below the carrier frequency. In this regard, analysis of efforts to utilize the prior digital phase detector approach to make very low phase noise measurements revealed the source of the limitation. Specifically, in an effort to use the prior digital phase detector approach to make such measurements, the signals from two DUTs were each applied to a prior digital phase detector. The outputs from the two prior digital phase detectors were then subtracted from one another and processed to determine the phase noise. Two identical phase measurement systems were used to estimate the cross phase noise spectrum in order to resolve DUT noise below the noise floor of the individual digital phase detectors. However, it was determined that the phase noise measurements were limited to approximately 150 dB/Hz below the carrier frequency in all but a very limited case. It was recognized that the reason for the limited applicability of the prior digital phase detector approach in making phase noise measurements beyond about 150 dB/Hz below the carrier frequency was attributable to the signal of one of the two DUTs being in phase or close to being in phase with the sampling clock when the other was near quadrature. During this period of time, the sampling clock's broadband noise has a substantially different effect on the samples of the signal associated with one DUT than it has on the samples of the signal associated with the other DUT. As a consequence, the signal output by one of the prior digital phase detectors and indicative of the phase difference between one DUT and the sample clock had different sampling clock noise than the output of the other prior digital phase detector. When two independent but similar measurements systems, such as the noted two prior digital phase detectors, are used to compute the cross phase noise spectrum, the impressed sampling clock noise associated with both systems prevents the results or output signals from averaging substantially below the noise level of a single system.

The present invention provides a digital phase detector that addresses the problem with the prior digital phase detector by utilizing the signals produced by two channels so that there is a more accurate representation of the noise associated with the sampling clock. In this regard, the two channels allow simultaneous measurement of the phase of the DUT using its signal at both the peak and the zero crossing. In one embodiment, the invention is comprised of signal splitter and phase shifter that receives the signal of the DUT and produces a first signal that is substantially identical to the signal of the DUT and a second signal that is phase-shifted relative to the first signal. A first analog-to-digital channel processes the first signal to produce an in-phase signal and a quadrature signal. The second signal is processed by a second analog-to-digital channel to produce a second set of in-phase and quadrature signals. A phase detector processes the two sets of in-phase and quadrature signals to produce a signal indicative of the phase difference between the signal of the DUT and a local oscillator signal (sample clock) that is common to each of the channels.

In one embodiment of the invention, the signal splitter and phase shifter operates to establish a phase shift between the first and second signals of 90° or thereabouts. With this degree of phase shift, each channel provides high quality signals to the phase detector during substantially the entire time that the other channel is providing low quality signals to the phase detector. Another embodiment the invention comprises a phase detector that calculates a phase difference by summing the quadrature signals provided by the two channels, summing the in-phase signals provided by the two channels, dividing the sum of the quadrature signals by the sum of the in-phase signals, and calculating the arctangent of the quotient of the division operation to produce a signal indicative of the phase difference.

Yet a further embodiment of the invention utilizes a direct digital synthesizer to produce a digital local oscillator signal. In one embodiment, the direct digital synthesizer is comprised of a digital sine wave generator for generating a digital signal that is representative of the amplitude of a sine wave at an angle of $2\pi kJ/M$ where J is an integer number of cycles of the sine wave, M is an integer number of sine wave amplitude values that are representative of the sine wave over J cycles, and k is an integer having a value in a range that extends from 1 to and including M. The sine wave generator can be implemented as a look-up table that stores each of the M values of the sine wave over the J number of cycles or as a calculator. The synthesizer is further comprised of a next value selector that causes the sine wave generator to produce a digital signal that is representative of the next amplitude of the sine wave, which is attained by increasing the value of k by 1. By appropriately choosing M to be an integer that is less than the clock frequency divided by the frequency bandwidth of the system within which the synthesizer is being utilized, spurious signals that may be produced by the generator are out of band and quantizing noise is confined to the spurs. Further, by appropriately choosing the values of J and M, the synthesizer can produce a digital signal that is any desired rational fraction of the frequency of the clock applied to the synthesizer. For instance if the clock has a frequency of 10 MHz, choosing 1 equal to 11 and M equal to 100 results in the synthesizer producing a signal with a frequency of 1.1 MHz. In applications requiring an analog signal, the synthesizer is adapted to include a digital-to-analog converter for converting the digital signal to an analog signal and, if needed, appropriate filtering.

DETAILED DESCRIPTION

Figure 1:
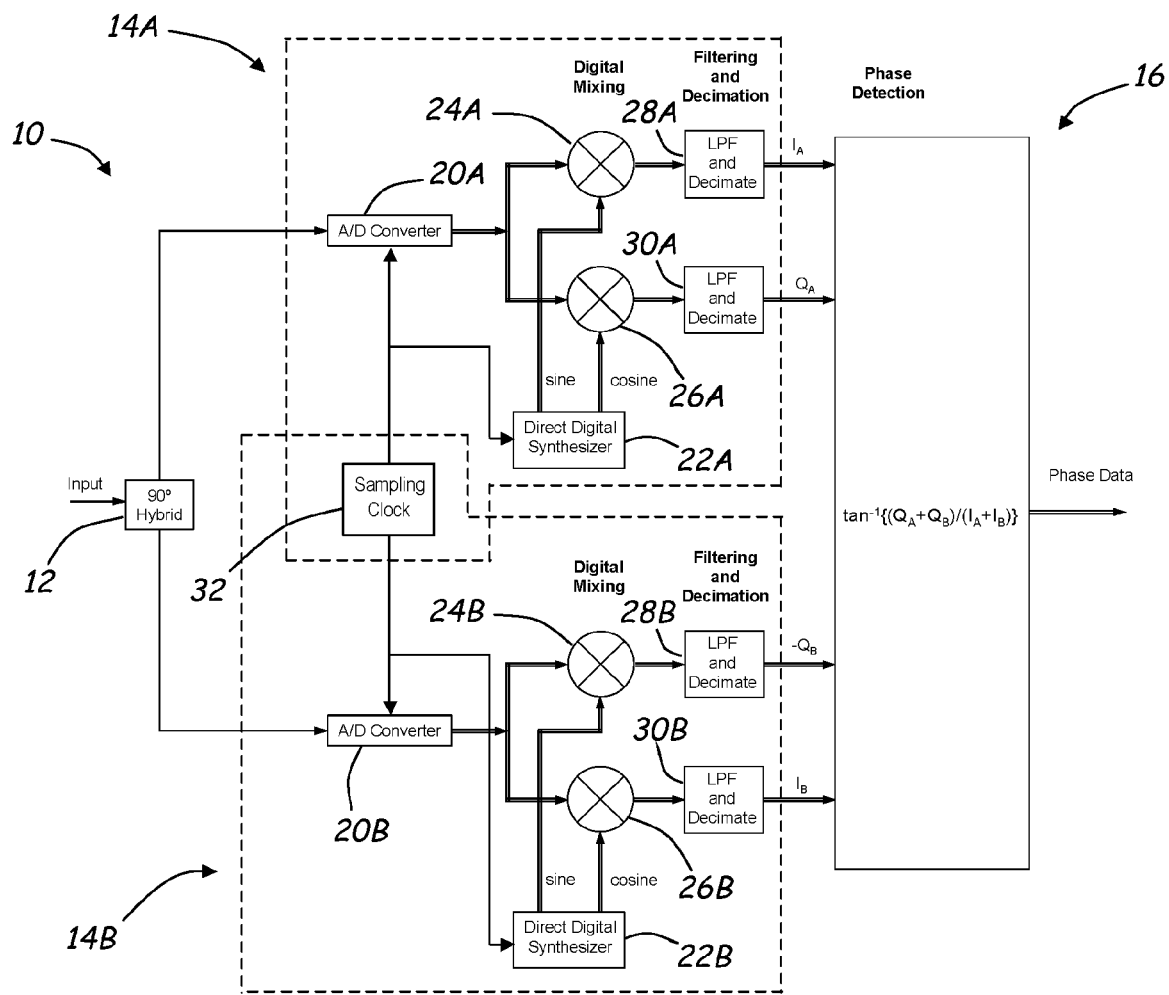
FIG. 1 is a schematic diagram of a two channel digital quadrature phase detector.

With reference to FIG. 1, an embodiment of a digital phase detector 10 according to the invention is described. Generally, the digital phase detector 10 is comprised of: (a) a signal splitter and phase shifter 12 for receiving an input signal, the phase of which is to be measured relative to a reference signal, and providing a first signal that is substantially identical to the input signal and second signal that is phase shifted by desired amount relative to the first signal; (b) a first analog-to-digital channel 14A for processing the first signal to produce a first in-phase signal and a first quadrature signal; (c) a second analog-to-digital channel 14B for processing the second signal to produce a second in-phase signal and a second quadrature signal; and (d) a phase detector 16 for processing the first and second in-phase signals and the first and second quadrature signals to produce a phase difference signal that is representative of the difference in phase between the signal received by the signal splitter and phase shifter 12 and a reference signal.

The signal splitter and phase shifter 12 preferably phase shifts the second signal by approximately 90° relative to the first signal. By shifting the phase by about 90°, the in-phase and quadrature signals provided to the phase detector 16 have substantially continuous high quality or useful information upon which to determine a phase difference. A phase difference of substantially less than 90° can be used and may be suitable for certain applications. However, the high quality or useful information upon which the phase detector operates will become increasing less continuous and, as a consequence, the phase difference calculated by the phase detector is likely to degrade.

The first analog-to-digital channel 14A is comprised of a analog-to-digital converter (ADC) 20A for receiving the first signal produced by the splitter and phase shifter 12, which is an analog signal, and generating a digital signal that is representative of the first signal. The channel 14A is further comprised of a direct digital synthesizer (DDS) 22A for producing digital sine and cosine local oscillator signals, a first digital multiplier (or mixer) 24A for multiplying the digital sine local oscillator signal by the digital signal produce by the ADC 20A, and a second digital multiplier 26A for multiplying the digital cosine local oscillator signal by the digital signal produced by the ADC 20A. The multiplications are each comprised of high frequency terms or components, as discussed in U.S. Pat. No. 4,090,145, which is incorporated by reference herein in its entirety. These high frequency terms are unnecessary to the determination of a phase difference. To eliminate the high frequency components resulting from the multiplication, the channel 14A further comprises a first digital low-pass filter and decimator 28A for receiving a digital signal that is the product of the multiplication performed by the first digital multiplier 24A, digitally filtering the signal, and decimating the filtered signal to produce a first digital in-phase signal. A second digital low-pass filter and decimator 30A is provided for receiving a digital signal that is the product of the multiplication performed by the second digital multiplier 26A, digitally filter the signal, and decimating the filtered signal to produce a first digital quadrature signal. A finite impulse response (FIR) filter can be employed for the filtering and decimation. Other types of filters known to those in the art are also feasible. It should also be appreciated that decimation may not be required in some applications. A sampling clock 32 provides a clock signal to the ADC 20A to cause the sampling of the first signal produced by the splitter and phase shifter 12. In addition, the clock signal drives the direct digital synthesizer 22A, i.e., provides the clock signal that the direct digital synthesizer uses to generate the digital sine and cosine local oscillator signals.

The second analog-to-digital channel 14B is identical to the first analog-to-digital channel 14A. Consequently, with the exception of the sampling clock 32, each of the components of the second analog-to-digital channel 14B is given a reference number that only differs from the corresponding component in the first analog-to-digital channel 14A by the "B" suffix. The operation of the components of the second analog-to-digital channel 14B is identical to that of the first analog-to-digital channel. However, the second analog-to-digital channel 14B operates on the second signal provided by the signal splitter and phase shifter 12. The second signal is approximately 90° phase shifted relative to the first signal that is provided by the signal splitter and phase shifter 12.

Further, the sampling clock 32 provides the clock signal to the ADC 20B to cause the sampling of the second signal produced by the splitter and phase shifter 12. The clock signal also drives the direct digital synthesizer 22B.

Figure 4:
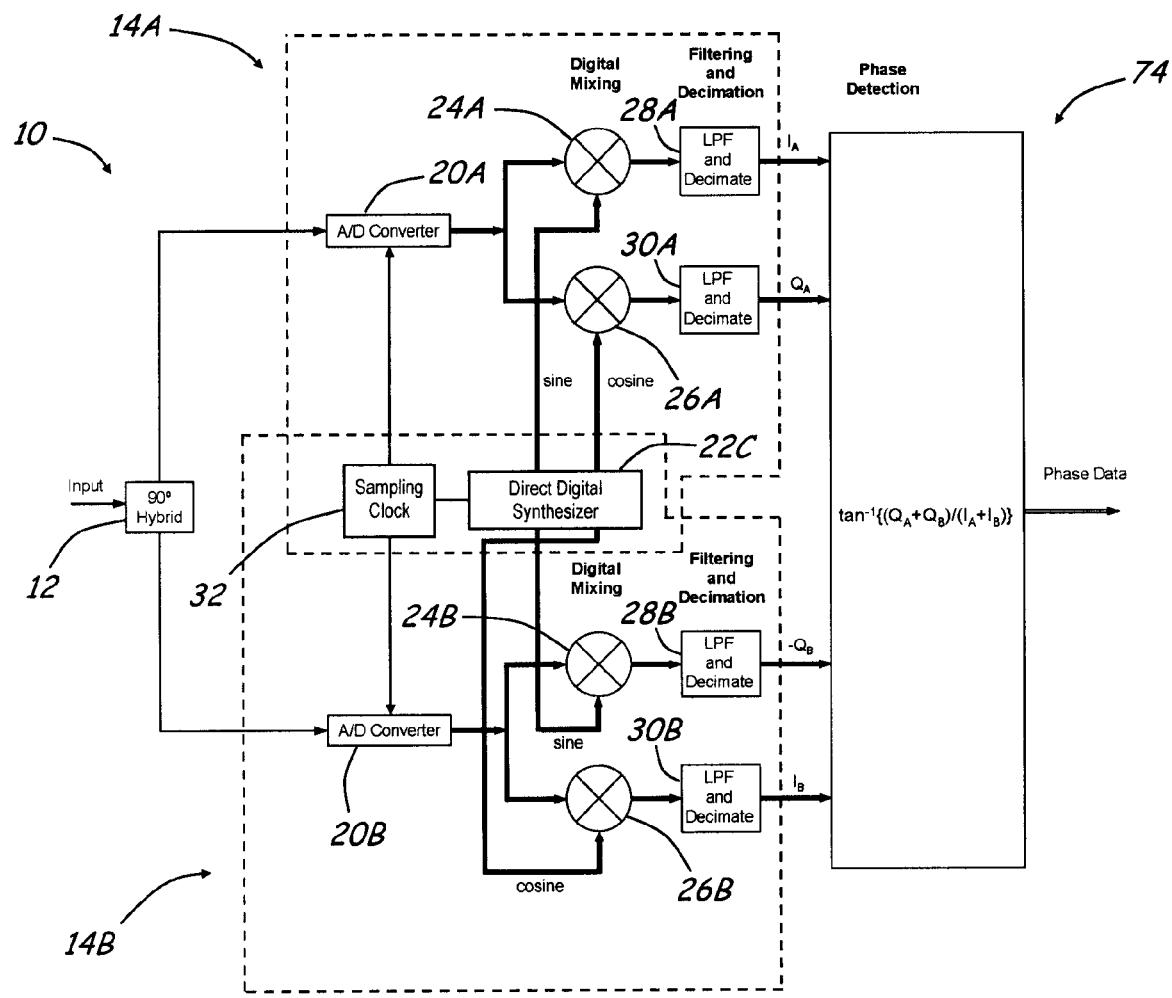
FIG. 4 is a schematic diagram of a two channel digital quadrature phase detector that employs one digital direct digital synthesizer for the first and second analog-to-digital channels.

It should be appreciated that the direct digital synthesizer 22A associated with the first channel 14A and the direct digital synthesizer 22B associated with the second channel 14B can be the same digital synthesizer. FIG. 4 illustrates the use of a single digital synthesizer 22C in a phase detector 74 that is otherwise identical to phase detector 16. The corresponding elements of phase detector 74 and phase detector 16 bear the same reference numbers. If the direct digital synthesizers 221, 22b are functional separate synthesizers, each direct digital synthesizer operates to produce digital local oscillator signals that have the same frequency and are in-phase with the digital local oscillator signals produced by the other direct digital synthesizer. In this regard, the direct digital synthesizers 22A, 22B can be identical to one another and driven with the same clock signal.

Operation of the phase detector 16 comprises receiving the first and second in-phase signals and the first and second quadrature signals and processing these signal to produce a phase data signal that is representative of the phase difference between the signal received by the signal splitter and phase shifter 12 and the sine signal whose digital version is produced by the direct digital synthesizers 22A, 22B. Processing of the signals comprises adding the first and second digital in-phase signals to one another to produce a digital in-phase sum signal, adding the first and second digital quadrature signals to one another to produce a digital quadrature sum signal, dividing the digital quadrature sum signal by the digital in-phase sum signal, and calculating the arctangent of the result of the division. The arctangent is representative of the phase difference between the signal applied to the signal splitter and phase shifter 12 and the digital local oscillator signal of the first and second analog-to-digital channels.

It should be appreciated that the mixing of the digital sine and cosine local oscillator signals with the signals output by the ADCs reduces the amount of digital signal processing needed to compute the phase difference. If the amount of digital signal processing needed to compute the phase difference is of no or little concern, the phase difference can be computed based solely on the output signals of the ADCs 20A, 20B. The computation that is performed is determination of the arctangent of the quotient of the digital signal output by the ADC 20A divided by the digital signal output by the ADC 20B followed by the removal of the linear term of the arctangent calculation, i.e., a least squares fit to straight line. The residuals from the fit are the phase deviations between the sampling clock signal and the DUT signal.

Figure 2:
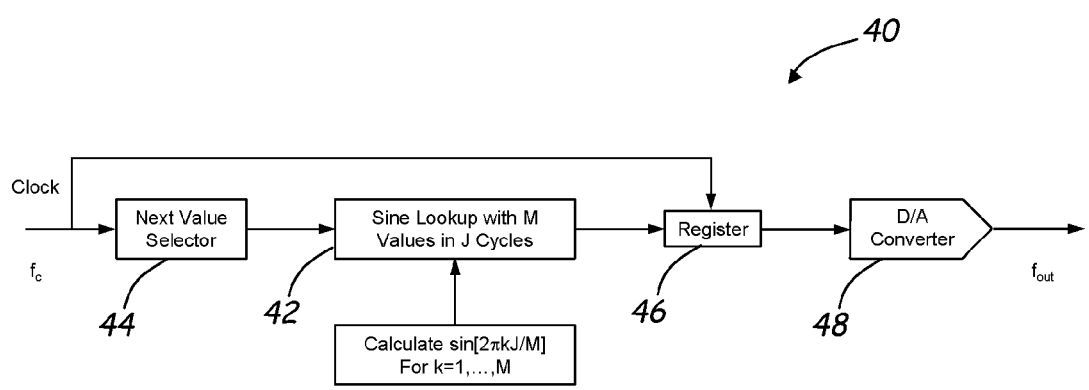
FIG. 2 is a schematic diagram of a direct digital synthesizer that is capable of being adapted for use in the dual channel digital quadrature phase detectors illustrated in FIG. 1 and FIG. 4.

With reference to FIG. 2, an embodiment of a direct digital synthesizer 40 is described that is capable of being adapted for use in the digital phase detector 10, as well as being used or adapted for other applications. The synthesizer 40 is comprised of: (a) digital memory 42 that holds a sine look-up table that has a plurality of digital signals that are each representative of the amplitude of a sine signal at a particular phase; (b) a next value selector 44 that receives a clock signal and, in response to the clock signal, causes the next value in the sine look-up table to be accessed; (c) a register 46 that holds a digital number provided by the sine look-up and, in response to the clock signal, makes the digital number currently being held available to a digital-to-analog converter; and (d) a digital-to-analog (D/A) converter 48 that converts the digital number provided by the register 46 into an analog signal.

The digital memory 42 is not restricted to any particular type of digital memory and can be a read-only memory or a programmable type of memory. The table is comprised of a plurality of digital numbers that are each representative of the amplitude of a sine wave at an angle of $2\pi kJ/M$ where J is an integer number of cycles of the sine wave, M is an integer number of sine wave amplitude values that are representative of the sine wave over J cycles, and k is an integer having a value in a range extending from 1 to and including M. It should be appreciated that the table can hold values associated with any periodic signal and is not restricted to a sine signal.

By appropriately choosing the value of M, certain spurious signal problems that are associated with other types of direct digital synthesizers are avoided. More specifically, by choosing M to be an integer value that is less than the frequency of the clock signal that is applied to the direct digital synthesizer 40 divided by the frequency bandwidth of the system within which the synthesizer operates, spurious signals are out-of-band and quantizing noise is in the spurious signals. Further, by appropriately choosing the values of M and J, the synthesizer can produce a signal with a frequency that is any rational fraction of the clock frequency. For example, if the clock signal that is applied to the next value selector 44 has a frequency of 10 MHz, choosing J to be 11 and M to be 100 will result in the synthesizer producing a signal with a frequency of 1.1 MHz.

In operation, the next value selector 44, in response to the clock signal, causes the digital value held in the first location of the look-up table held in the memory 42 to be output. The digital value is representative of the amplitude of a sine signal at an angle of $(2\pi)(1)(J)/(M)$. The register 46 holds the digital value output by the memory. The next cycle of the clock signal causes the digital value held by the register to be provided to the D/A converter 48, which converts the digital value to an analog signal. Further, the next cycle of the clock signal cause the next digital value held in the look-up table, a digital value that is representative of the amplitude of the sine wave at an angle of $(2\pi)(2)(J)/(M)$, to be output to the register 46. The process is repeated until all of the digital values of table have been output. Once all of the digital values have been output, the process is repeated from the beginning of the look-up table.

It should be appreciated that the memory 42 can be replaced with a calculator that determines digital number representative of the amplitude of a sine wave an angle of $2\pi kJ/M$. In such an embodiment, the next value selector causes, in response to the clock signal, the calculator to calculate a digital number that is representative of the amplitude of a sin wave at an angle of $2\pi kJ/M$ where k has been incremented by one relative to the immediately prior calculation.

To adapt the direct digital synthesizer 40 to digital applications in which a digital signal and not an analog signal is needed, like the digital phase detector 10, the D/A converter 48 is eliminated. Further, to adapt the digital synthesizer 40 to applications in which an in-phase signal and a quadrature signal are needed, a second memory with a cosine look-up table, second register, and second D/A converter that operate in parallel with the memory 42, register 46, and D/A converter 48 can be employed. More generally, in applications in which a periodic signal and one or more phase shifted version of the signal are needed, several parallel memories, calculators, or combinations of memories and calculators that are each triggered by the operation of the next value selector 44 can be employed.

Figure 3:
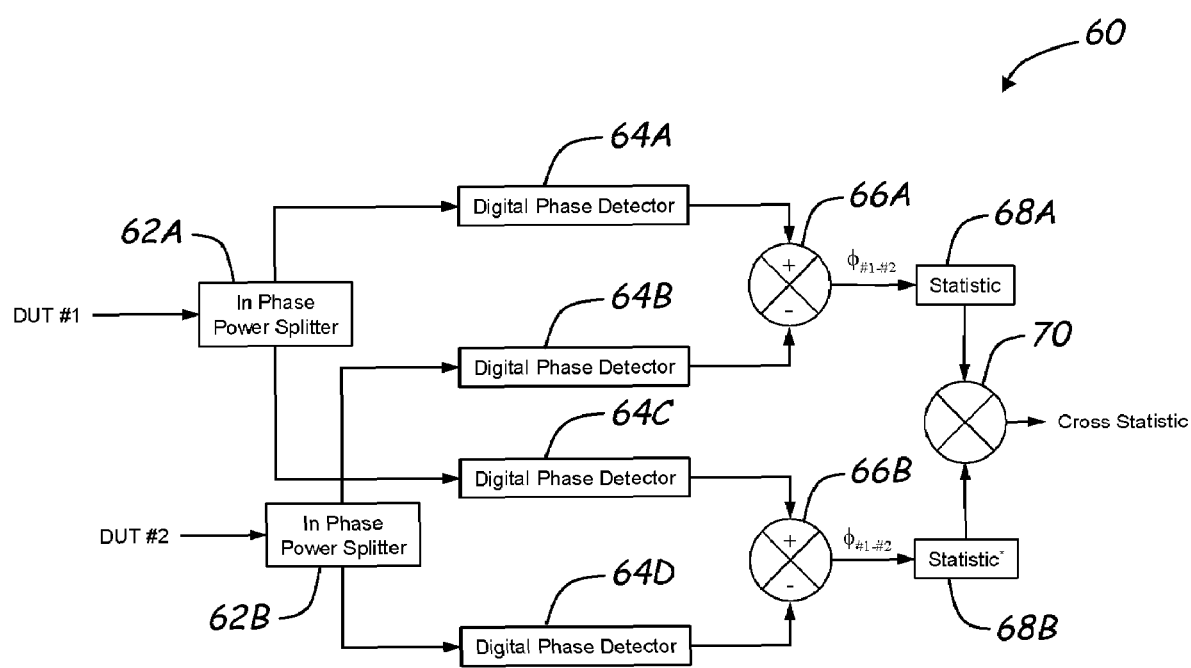
FIG. 3 is a schematic diagram of a system for making a low phase noise measurement that embodies four, two channel digital phase detectors.

With reference to FIG. 3, a system 60 that is capable of making a phase measure that is more than 150 dB/Hz below a carrier frequency. The system 60 is used to measure the phase difference between a first DUT and a second DUT. The system 60 is comprised of a first in-phase power splitter 62A for receiving the analog signal of a first DUT and producing two output signals that are substantially identical to the analog signal of the first DUT; a second in-phase power splitter 62B for receiving the analog signal of the second DUT; digital phase detectors 64A, 64B, 64C, and 64D that are each designed in accordance with the inventive two channel digital phase detector described hereinabove and share a common sampling clock; subtractor 66A for determining a phase difference between the first and second DUTs based upon the signals provided by the digital phase detectors 64A, 64B; subtractor 66B for determining a phase difference between the first and second DUTs based upon the signals provided by the digital phase detectors 64C, 64D.

The phase difference between the first and second DUTs provided by the subtractor 66A is substantially devoid of noise attributable to the common sampling clock due to the subtraction of the signals provided the digital phase detectors 64A, 64B. In some application, the phase difference provided at the output of the subtractor 66A may be of sufficient quality. The same can also be said with respect to the phase difference provided at the output of the subtractor 66B. However, it should be appreciated that the phase difference provided at the output of the subtractor 66B comes from a phase difference measurement system that is independent of the phase difference measurement system that provides the phase difference at the output of subtractor 66A. This independent facilitates the determination of additional or improved phase difference information relative to the phase differences provided by the either the subtractor 66A or the subtractor 66B, independently.

The system 60 further comprises a statistical computer 68A that is capable of processing the phase difference signal output by the subtractor 66A. The statistical computer is capable of computing, for example, the discrete Fourier transform or the second difference of the phase difference signal. A statistical computer 68B provides the same functionality with respect to the difference signal output by the subtractor 66B. In many instances, the statistical phase difference related information provided by either or both of the statistical computers 68A, 68B is sufficient. However, the system 60 further comprises a cross statistic calculator 70 that, computes the product of the statistic provided by statistical calculator 68A and the complex conjugate of a the same statistic provided by statistical calculator 68B. Cross correlation and averaging of the output of the cross statistical calculator 70 allows uncorrelated noise associated with the ADCs and other components of the system to be reduced.

The foregoing description of the invention is intended to explain the best mode known of practicing the invention and to enable others skilled in the art to utilize the invention in various embodiments and with the various modifications required by their particular applications or uses of the invention. In this regard, it should be appreciated that, although the digital phase detector has been described with respect to the generation of a phase difference, such phase difference signals can be used in number applications, including but not limited to phase noise measurement systems, phase detection of received signals (e.g., radar signals and communication signals), phase detection of signals received from separate elements in a phased array antenna system, and phase detection within oscillator phase-locked loops.

What is claimed is:

1. A digital phase detector comprising:
    a signal splitter and phase shifter for receiving an analog input signal and producing a first analog signal that is substantially identical to said analog input signal and a second analog signal that is substantially identical to said analog input signal but phase shifted relative to said first analog signal;
    a first analog-to-digital channel for receiving and processing said first analog signal to produce a first digital in-phase signal and a first digital quadrature signal;
    a second analog-to-digital channel for receiving and processing said second analog signal to produce a second digital in-phase signal and a second digital quadrature signal; and
    a phase detector for receiving and processing said first digital in-phase signal, first digital quadrature signal, second digital in-phase signal, and second digital quadrature signal to produce a digital phase signal representative of a phase measurement of an analog input signal.

2. A digital phase detector, as claimed in claim 1, wherein:
    said signal splitter and phase shifter is adapted to phase shift said second analog signal approximately 90° relative to said first analog signal.

3. A digital phase detector, as claimed in claim 1, wherein:
    said phase detector comprises a calculator for computing an arctangent of a value that is a quotient of a sum of said first and second digital quadrature signals divided by a sum of said first and second digital in-phase signals.

4. A digital phase detector, as claimed in claim 1, wherein:
    said first and second analog-to-digital channels each comprise a direct digital synthesizer.

5. A digital phase detector, as claimed in claim 4, wherein:
    each of said direct digital synthesizers comprises means for providing a digital signal representative of the amplitude of a sine wave at an angle of $2\pi kJ/M$ where J is an integer number of cycles of said sine wave, M is an integer number of sine wave data values representing J cycles of said sine wave, and k is a number having a value in a range of 1 to and including M.

6. A digital phase detector, as claimed in claim 4, wherein:
    each of said digital synthesizers is capable of providing a signal representative of the amplitude of a sine wave having a frequency that is a rational fraction of the frequency of a clock signal applied to each of said digital synthesizers.

7. A digital phase-detector, as claimed in claim 1, wherein:
    said first and second analog-to-digital channels each comprise an analog-to-digital converter.

8. A digital phase-detector, as claimed in claim 7, further comprising:
    a sampling clock for providing a sampling signal to said analog-to-digital converter associated with each of said first and second analog-to-digital channels.

9. A digital phase-detector, as claimed in claim 1, wherein:
    said first and second analog-to-digital channels each comprise a first digital mixer, second digital mixer, and a direct digital synthesizer.

10. A digital phase detector, as claimed in claim 9, wherein:
    said direct digital synthesizer associated with said first analog-to-digital channel and said direct digital synthesizer associated with the second analog-to-digital channel are the same direct digital synthesizer.

11. A digital phase detector, as claimed in claim 1, wherein:
said first and second analog-to-digital channels each comprise a digital low pass filter.

12. A digital phase detector, as claimed in claim 1, wherein:
said first and second analog-to-digital channels each comprise a digital decimator.

13. A digital phase detector, as claimed in claim 1, wherein:
said first and second analog-to-digital channels each comprises a sampling clock.

14. A digital phase detector, as claimed in claim 13, wherein:
said sampling clock is the same sampling clock for both of said first and second analog-to-digital channels.

15. A digital phase-detector, as claimed in claim 1, wherein:
said first and second analog-to-digital channels each comprise a direct digital synthesizer.

16. A digital phase-detector, as claimed in claim 15, further comprising:
a sampling clock for providing a sampling signal to said direct digital synthesizer associated with each of said first and second analog-to-digital channels.

17. A digital phase-detector, as claimed in claim 1, wherein:
said first and second analog-to-digital channels each comprise an analog-to-digital converter and a direct digital synthesizer.

18. A digital phase-detector, as claimed in claim 17, further comprising:
a sampling clock for providing a sampling signal to said analog-to-digital converter associated with each of said first and second analog-to-digital channels and providing a drive signal to said direct digital synthesizer associated with each of said first and second analog-to-digital channels.

19. A digital phase-detector, as claimed in claim 18, wherein:
said direct digital synthesizer associated with each of said first and second analog-to-digital channels is the same direct digital synthesizer.

20. A digital phase-detector, as claimed in claim 1, wherein:
said first analog-to-digital channel comprises a first analog-to-digital converter for receiving said first analog signal and converting said first analog signal into a first digital signal; and
said second analog-to-digital channel comprises a second analog-to-digital converter for receiving said second analog signal and converting said second analog signal into a second digital signal.

21. A digital phase-detectors, as claimed in claim 20, wherein:
said first analog-to-digital channel comprises a first pair of mixers, each for receiving said first digital signal;
said second analog-to-digital channel comprises a second pair of mixers, each for receiving said second digital signal.

22. A digital phase detector comprising:
a signal splitter and phase shifter for receiving an analog input signal and producing a first analog signal that is substantially identical to said analog input signal and a second analog signal that is substantially identical to said analog input signal but phase shifted relative to said first analog signal;
a first analog-to-digital channel for receiving and processing said first analog signal to produce a first digital signal that is representative of said first analog signal;
a second analog-to-digital channel for receiving and processing said second analog signal to produce a second digital signal that is representative of said second analog signal; and
a phase detector for receiving and processing said first digital signal and said second digital signal to produce a digital phase signal representative of a phase measurement of an analog input signal.

23. A digital phase detector, as claimed in claim 22, wherein:
said phase detector and phase shifter is adapted to phase shift said second analog signal approximately 90° relative to said first analog signal.

24. A digital phase detector, as claimed in claim 22, wherein:
said phase detector comprises a calculator for computing an arctangent of a quotient of said first digital signal divided by said second digital signal.

* * * * *

UNITED STATES PATENT AND TRADEMARK OFFICE
CERTIFICATE OF CORRECTION

PATENT NO. : 7,227,346 B1 Page 1 of 1
APPLICATION NO. : 11/161946
DATED : June 5, 2007
INVENTOR(S) : Solbrig It is certified that error appears in the above-identified patent and that said Letters Patent is hereby corrected as shown below:

Column 3, line 29, delete "1 equal"; and insert --J equal--.

Signed and Sealed this

Thirty-first Day of July, 2007

JON W. DUDAS
*Director of the United States Patent and Trademark Office*